(12) United States Patent
Guevremont et al.

(10) Patent No.: US 7,225,096 B2
(45) Date of Patent: May 29, 2007

(54) METHOD OF CONTROLLING AND CORRECTING AN ASYMMETRIC WAVEFORM

(75) Inventors: Roger Guevremont, Ottawa (CA); Lucien Potvin, Kanata (CA)

(73) Assignee: Thermo Finnigan LLC, San Jose, CA (US)

( * ) Notice: Subject to any disclaimer, the term of this patent is extended or adjusted under 35 U.S.C. 154(b) by 77 days.

(21) Appl. No.: 10/529,305

(22) PCT Filed: Sep. 5, 2003

(86) PCT No.: PCT/CA03/01351

§ 371 (c)(1),
(2), (4) Date: Mar. 25, 2005

(87) PCT Pub. No.: WO2004/030023

PCT Pub. Date: Apr. 8, 2004

(65) Prior Publication Data

US 2006/0052960 A1    Mar. 9, 2006

Related U.S. Application Data

(60) Provisional application No. 60/413,162, filed on Sep. 25, 2002.

(51) Int. Cl.
G01R 35/00 (2006.01)

(52) U.S. Cl. .................... 702/106; 324/138

(58) Field of Classification Search ............. 702/57, 702/64–67, 70–73, 75, 77, 85, 106, 189, 702/190, 193, 194; 250/282, 286, 292; 356/437; 379/24; 331/2, 14; 327/94; 324/138
See application file for complete search history.

(56) References Cited

U.S. PATENT DOCUMENTS

| | | | | |
|---|---|---|---|---|
| 5,173,749 A | * | 12/1992 | Tell et al. | 356/437 |
| 5,404,388 A | * | 4/1995 | Eu | 379/24 |
| 5,793,642 A | | 8/1998 | Frisch et al. | |
| 5,801,379 A | | 9/1998 | Kouznetsov | |

FOREIGN PATENT DOCUMENTS

| | | |
|---|---|---|
| EP | 0 701 138 | 3/1996 |
| WO | WO 92/15150 | 9/1992 |

* cited by examiner

*Primary Examiner*—Marc S. Hoff
*Assistant Examiner*—Mohamed Charioui
(74) *Attorney, Agent, or Firm*—Freedman & Associates

(57) ABSTRACT

Disclosed is a method of controlling an asymmetric waveform generated as a combination of two sinusoidal waves having a frequency that differs by a factor of two. A method according to the instant invention includes a step of sampling a generated asymmetric waveform to obtain a set of data points, the set of data points being indicative of the generated asymmetric waveform. The sampled data points are arranged in an order according to magnitude, and then compared to template data relating to a desired asymmetric waveform. In dependence upon the comparison, a correction to the generated asymmetric waveform is determined.

18 Claims, 9 Drawing Sheets

METHOD OF CONTROLLING AND CORRECTING AN ASYMMETRIC WAVEFORM

This application claims the benefit of U.S. Provisional Application No. 60/413,162, filed Sep. 25, 2002.

FIELD OF THE INVENTION

The instant invention relates generally to high field asymmetric waveform ion mobility spectrometry (FAIMS), more particularly the instant invention relates to a method of optimizing asymmetric waveform generator LC tuning electronics.

BACKGROUND OF THE INVENTION

High sensitivity and amenability to miniaturization for field-portable applications have helped to make ion mobility spectrometry (IMS) an important technique for the detection of many compounds, including narcotics, explosives, and chemical warfare agents as described, for example, by G. Eiceman and Z. Karpas in their book entitled "Ion Mobility Spectrometry" (CRC, Boca Raton, 1994). In IMS, gas-phase ion mobilities are determined using a drift tube with a constant electric field. Ions are separated in the drift tube on the basis of differences in their drift velocities. At low electric field strength, for example 200 V/cm, the drift velocity of an ion is proportional to the applied electric field strength, and the mobility, K, which is determined from experimentation, is independent of the applied electric field. Additionally, in IMS the ions travel through a bath gas that is at sufficiently high pressure that the ions rapidly reach constant velocity when driven by the force of an electric field that is constant both in time and location. This is to be clearly distinguished from those techniques, most of which are related to mass spectrometry, in which the gas pressure is sufficiently low that, if under the influence of a constant electric field, the ions continue to accelerate.

E. A. Mason and E. W. McDaniel in their book entitled "Transport Properties of Ions in Gases" (Wiley, New York, 1988) teach that at high electric field strength, for instance fields stronger than approximately 5,000 V/cm, the ion drift velocity is no longer directly proportional to the applied electric field, and K is better represented by $K_H$, a non-constant high field mobility term. The dependence of $K_H$ on the applied electric field has been the basis for the development of high field asymmetric waveform ion mobility spectrometry (FAIMS). Ions are separated in FAIMS on the basis of a difference in the mobility of an ion at high field strength, $K_H$, relative to the mobility of the ion at low field strength, K. In other words, the ions are separated due to the compound dependent behavior of $K_H$ as a function of the applied electric field strength.

In general, a device for separating ions according to the FAIMS principle has an analyzer region that is defined by a space between first and second spaced-apart electrodes. The first electrode is maintained at a selected dc voltage, often at ground potential, while the second electrode has an asymmetric waveform V(t) applied to it. The asymmetric waveform V(t) is composed of a repeating pattern including a high voltage component, $V_H$, lasting for a short period of time $t_H$ and a lower voltage component, $V_L$, of opposite polarity, lasting a longer period of time $t_L$. The waveform is synthesized such that the integrated voltage-time product, and thus the field-time product, applied to the second electrode during each complete cycle of the waveform is zero, for instance $V_H t_H + V_L t_L = 0$; for example +2000 V for 10 µs followed by −1000 V for 20 µs. The peak voltage during the shorter, high voltage portion of the waveform is called the "dispersion voltage" or DV, which is identically referred to as the applied asymmetric waveform voltage.

Generally, the ions that are to be separated are entrained in a stream of gas flowing through the FAIMS analyzer region, for example between a pair of horizontally oriented, spaced-apart electrodes. Accordingly, the net motion of an ion within the analyzer region is the sum of a horizontal x-axis component due to the stream of gas and a transverse y-axis component due to the applied electric field. During the high voltage portion of the waveform, an ion moves with a y-axis velocity component given by $v_H = K_H E_H$, where $E_H$ is the applied field, and $K_H$ is the high field ion mobility under operating electric field, pressure and temperature conditions. The distance traveled by the ion during the high voltage portion of the waveform is given by $d_H = v_H t_H = K_H E_H t_H$, where $t_H$ is the time period of the applied high voltage. During the longer duration, opposite polarity, low voltage portion of the asymmetric waveform, the y-axis velocity component of the ion is $v_L = K E_L$, where K is the low field ion mobility under operating pressure and temperature conditions. The distance traveled is $d_L = v_L t_L = K E_L t_L$. Since the asymmetric waveform ensures that $(V_H t_H) + (V_L t_L) = 0$, the field-time products $E_H t_H$ and $E_L t_L$ are equal in magnitude. Thus, if $K_H$ and K are identical, $d_H$ and $d_L$ are equal, and the ion is returned to its original position along the y-axis during the negative cycle of the waveform. If at $E_H$ the mobility $K_H > K$, the ion experiences a net displacement from its original position relative to the y-axis. For example, if a positive ion travels farther during the positive portion of the waveform, for instance $d_H > d_L$, then the ion migrates away from the second electrode and eventually will be neutralized at the first electrode.

In order to reverse the transverse drift of the positive ion in the above example, a constant negative dc voltage is applied to the second electrode. The difference between the dc voltage that is applied to the first electrode and the dc voltage that is applied to the second electrode is called the "compensation voltage" (CV). The CV prevents the ion from migrating toward either the second or the first electrode. If ions derived from two compounds respond differently to the applied high strength electric fields, the ratio of $K_H$ to K may be different for each compound. Consequently, the magnitude of the CV that is necessary to prevent the drift of the ion toward either electrode is also different for each compound. Thus, when a mixture including several species of ions, each with a unique $K_H/K$ ratio, is being analyzed by FAIMS, only one species of ion is selectively transmitted to a detector for a given combination of CV and DV. In one type of FAIMS experiment, the applied CV is scanned with time, for instance the CV is slowly ramped or optionally the CV is stepped from one voltage to a next voltage, and a resulting intensity of transmitted ions is measured. In this way a CV spectrum showing the total ion current as a function of CV, is obtained.

In FAIMS, the optimum asymmetric waveform voltage for obtaining the maximum possible ion detection sensitivity on a per cycle basis takes the shape of an asymmetric square wave with a zero time-averaged value. In practice this asymmetric square waveform is difficult to produce and apply to the FAIMS electrodes because of electrical power consumption considerations. For example, without a tuned circuit the power P which would be required to drive a capacitive load of capacitance C, at frequency f, with a peak voltage V, is $2\pi V^2 fC$. Accordingly, if a square wave at 750 kHz, 4000 V peak voltage is applied to a 20 picofarad load, the power consumption will be 240 Watts. If, on the other hand, a waveform is applied via a tuned circuit, the power consumption is reduced to P(cos Θ) where Θ is the angle between the current and the voltage applied to the capacitive load. This power consumption approaches zero if the current and voltage are out of phase by 90 degrees, as they would be in a perfectly tuned LC circuit.

Since a tuned circuit cannot provide a square wave, an approximation of a square wave is taken as the first terms of a Fourier series expansion. One approach is to use:

$$V(t)=\tfrac{2}{3}D\sin(\omega t)+\tfrac{1}{3}D\sin(2\omega t-\pi/2) \qquad (1)$$

Where V(t) is the asymmetric waveform voltage as a function of time, D is the peak voltage (defined as dispersion voltage DV), ω is the waveform frequency in radians/sec. The first term is a sinusoidal wave at frequency ω, and the second term is a sinusoidal wave at double the frequency of the first sinusoidal wave, 2ω. The second term could also be represented as a cosine, without the phase shift of π/2.

In practice, both the optimization of the LC tuning and maintenance of the exact amplitude of the first and second applied sinusoidal waves and the phase angle between the two waves is required to achieve long term, stable operation of a FAIMS system powered by such an asymmetric waveform generator. Accordingly, feedback control is required to ensure that the output signal is stable and that the correct waveform shape is maintained.

In U.S. Pat. No. 5,801,379, which was issued on Sep. 1, 1998, Kouznetsov teaches a high voltage waveform generator having separate phase correction and amplitude correction circuits. This system uses additional hardware components in the separate phase correction and amplitude correction circuits, thereby increasing complexity and increasing the cost of manufacturing and testing the devices. Furthermore, this system cannot be implemented into control software, making it difficult to vary certain parameters.

It is an object of the instant invention to provide a method of optimizing asymmetric waveform generator LC tuning electronics that overcomes the limitations of the prior art.

SUMMARY OF THE INVENTION

In accordance with an aspect of the instant invention there is provided a method of controlling an asymmetric waveform generated as a combination of two sinusoidal waves having a frequency that differs by a factor of two, the method comprising the steps of: sampling the generated asymmetric waveform to obtain a set of data points that is indicative of the generated asymmetric waveform; arranging the sampled data points in an order according to magnitude; comparing the arranged sampled data points to template data relating to a desired asymmetric waveform; and, in dependence upon the comparison, determining a correction to the generated asymmetric waveform.

In accordance with another aspect of the instant invention there is provided a method of controlling an asymmetric waveform generated as a combination of two sinusoidal waves having a frequency that differs by a factor of two, the method comprising the steps of: obtaining a set of data points that is indicative of the generated asymmetric waveform; arranging the data points in an order according to magnitude; obtaining template data including a set of data points relating to a desired asymmetric waveform; comparing values of data points within a predetermined range of the arranged data points to values of data points within a corresponding predetermined range of the template data; and, in dependence upon the comparison, adjusting at least one of a phase angle difference between the two sinusoidal waves and an amplitude of at least one of the two sinusoidal waves.

In accordance with yet another aspect of the instant invention there is provided a storage medium encoded with machine-readable computer program code for controlling an asymmetric waveform generated as a combination of two sinusoidal waves having a frequency that differs by a factor of two, the storage medium including instructions for: obtaining a set of data points that is indicative of the generated asymmetric waveform; arranging the data points in an order according to magnitude; obtaining template data including a set of data points relating to a desired asymmetric waveform; comparing values of data points within a predetermined range of the arranged data points to values of data points within a corresponding predetermined range of the template data; and, in dependence upon the comparison, adjusting at least one of a phase angle difference between the two sinusoidal waves and an amplitude of at least one of the two sinusoidal waves.

BRIEF DESCRIPTION OF THE DRAWINGS

Exemplary embodiments of the invention will now be described in conjunction with the following drawings, in which similar reference numerals designate similar items.

DETAILED DESCRIPTION OF THE DRAWINGS

The following description is presented to enable a person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and the scope of the invention. Thus, the present invention is not intended to be limited to the embodiments disclosed, but is to be accorded the widest scope consistent with the principles and features disclosed herein.

As is noted above, the ideal waveform applied in FAIMS is a combination of two sinusoidal waves of frequency ω and 2ω. The two waves are of amplitudes that differ by a factor of two and are also offset by a phase angle (Θ) of π/2 radians (equivalent to 90°), resulting in a waveform that is defined by Equation 2, below:

$$V(t)=A\sin(\omega t)+B\sin(2\omega t-\Theta) \quad (2)$$

where V(t) is the asymmetric waveform voltage as a function of time, A is the amplitude of the first sinusoidal wave at frequency ω, where ω is the waveform frequency in radians/sec, and B is the amplitude of the second sinusoidal wave at a frequency 2ω.

In a waveform having an optimum shape, A=2B, and Θ is equal to π/2. The electronic circuit must maintain these two conditions in order to achieve the waveform with the correct asymmetric waveform shape for stable performance of a FAIMS system attached thereto. Additionally, the peak voltage on the highest voltage side of the asymmetric waveform (defined as DV above) must be maintained constant, and equal to A+B. The electronic circuit should therefore track, modify and control three parameters to maintain the three desired relationships of the two component sinusoidal waves and to obtain the desired waveform.

Figure 1:
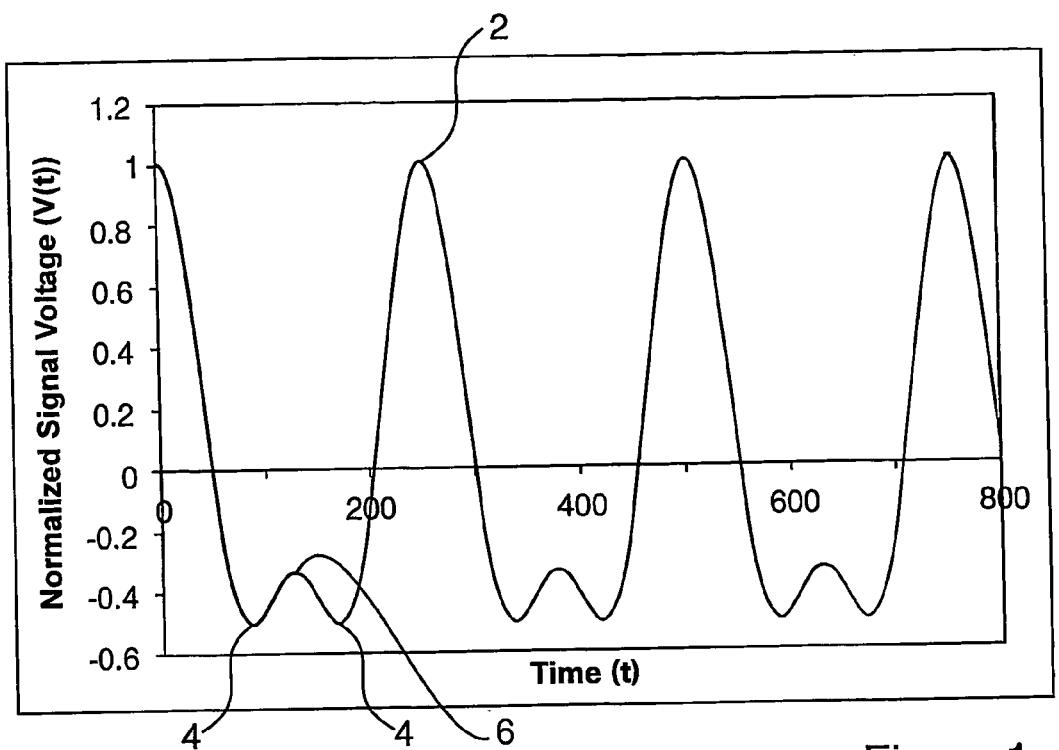
FIG. 1 shows a plurality of cycles of an asymmetric waveform that is formed as a combination of first and second sinusoidal waves of frequency ω and 2ω, respectively.

Referring to FIG. 1, shown is a plurality of cycles of an asymmetric waveform that is formed as a combination of first and second sinusoidal waves of frequency ω and 2ω, respectively. The correct asymmetric waveform shape shown in FIG. 1 is established by collecting sample data points from the waveform, for example by analog-to-digital (A/D) sampling, in order to acquire a representative set of data points from all portions of the asymmetric waveform. In other words, the A/D data points are taken randomly, at frequencies that are higher or lower than the waveform itself. However, it is necessary that this array of data points of the signal intensity of the asymmetric waveform correctly represent all time periods within the waveform. For example, the sample data points should include points near the peak voltage 2 in the polarity of maximum voltage applied, as well as points near the two peaks 4 of maximum voltage at the other polarity and in the dip 6 between the two peaks 4. If the waveform is sampled across all times, the series of points thus acquired can be subjected to simple tests to determine if the waveform shape is optimum.

By way of a non-limiting example, if a perfect sinusoidal wave (not shown) is sampled, the number of data points with positive measured signal equals the number of data points with negative measurements. Similarly the number of points at any given measurement value (signal voltage) in the positive polarity equals those of the same absolute negative voltage. These results are predicted because of the symmetry of the original sinusoidal wave.

A similar analysis is possible for the asymmetric waveform used in FAIMS. For example, the maximum signal voltage on one polarity must not equal the maximum measured signal of the opposite polarity. The maximum measurement is expected to correspond to A+B as described above, and the opposite polarity maximum is expected to be (A+B)/2. Moreover, since there is one peak 2 in the first, maximum polarity side of the waveform, and two peaks 4 in the opposite polarity, the number of points at each of these two values of signal measurement differ, while remaining higher in number than most other measurement values. However, because of the shape of the asymmetric waveform another measurement value will be significant, and this is the value of the dip 6 between the two peaks on the lower voltage side of the asymmetric waveform. Since the voltage is temporarily invariant in this valley, the number of data points with this measurement value is anomalously high when compared to a sinusoidal waveform, which lacks any significant numbers of data points other than at the maxima. From the definition of the asymmetric waveform function, the measured signal in the dip 6 is expected to be A−B.

Referring again to FIG. 1, illustrated are several cycles of an asymmetric waveform that is formed according to Equation 2 above for A+B=1 and A/B=2. The peak values 2 of the waveform are therefore equal to A+B. The opposite polarity part of the waveform, negative polarity in this example, is characterized by a dip 6 and two peak values 4. As noted above, the peak 2 in one polarity is A+B. The value at dip 6 is A−B (in this case A−B=⅓), and the peaks 4 in the opposite polarity are each (A+B)/2 (in this case (A+B)/2=½).

Figure 2:
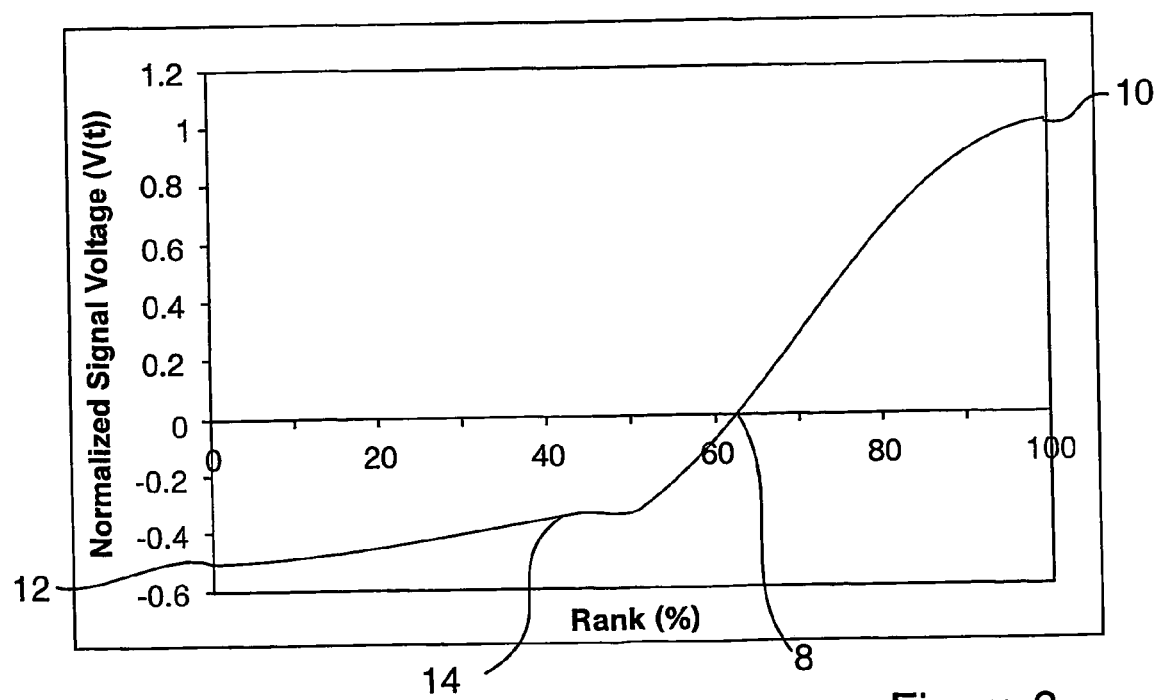
FIG. 2 shows a distribution of data points from one cycle of the waveform shown in FIG. 1.

Referring now to FIG. 2, shown is a distribution of the signal voltage for the ideal waveform of FIG. 1. Data points are obtained by calculating the signal voltage V(t) at a given time t using Equation 2. The data points are then sorted from most negative to most positive signal value and are plotted sequentially as individual data points along the horizontal axis. This provides a curve that is characteristic of the shape of the waveform. For simplicity, the total number of data points has been normalized to 100 percent. In other words, the horizontal axis in FIG. 2 is the rank of the data points, expressed as a percent. If 1000 points are calculated and arranged in order of magnitude, then the smallest point is 0.1%, the 500th point is 50% and point 1000 is at 100% on the horizontal axis of FIG. 2.

Referring still to FIG. 2, about 62% of the data points are of negative polarity and the remainder are positive. The polarity cross-over point is labeled 8 in the figure. The maximum voltage of points in the positive polarity is labeled at 10 and has a normalized magnitude near 1. The most negative voltage data points are labeled at 12 on the figure, and have a normalized voltage near −0.5. At point labeled 14 on the figure, it is clear that a number of data points correspond to amplitude near 0.33, at about 50% of the data points as indicated by the labels on the x-axis. These are the data points from the dip 6 in FIG. 1.

The curves shown in FIG. 1 and FIG. 2 are illustrative of results that are obtained for an ideal asymmetric waveform. Three specific types of deviation from the ideal asymmetric waveform are discussed in greater detail, as follows: first, a phase shift error; second an error in the ratio of A/B (keeping A+B=1); and third, an error in the sum of A+B (keeping the ratio A/B=2). The electronics of a not illustrated asymmetric waveform generator may be used to identify such deviations from the ideal waveform shape, and make adjustments to the drive electronics accordingly.

Having regard to the first type of deviation, if the two sinusoidal waves that are added together to create the asymmetric waveform shown in FIG. 1 are shifted in phase angle, then the two minima 4 in FIG. 1 will have different values. In other words, one of the minima becomes more negative whilst the other of the minima becomes less negative. If, for example, a 5% error is imposed upon the phase angle, that is to say 5% of 90 degrees, then the values of the two minima 4 become quite different. Under these experimental conditions of distorted waveform, the signal voltage of the data points of the most negative values become more negative than expected by about 4%. In other words, the data points labeled 12 in FIG. 2 change from a normalized signal voltage of about −0.5 to about −0.52 when the 5% phase angle error is imposed.

In the second type of deviation the ratio A/B varies while retaining the normalized relationship A+B=1. The second type of deviation causes an error in the value of the dip 6 shown on FIG. 1. For example, if A/B is 1.9, and the data points from this distorted version of the asymmetric waveform are arranged in order of ascending values, from negative to positive as was described with reference to FIG. 2, the signal voltage of the points that appear near a rank of 50% become less negative and create a relative error of about 6% compared to corresponding points for the ideal waveform, which appear near label 14 in FIG. 2.

In the third type of deviation the ratio A/B=2 is constant but the sum A+B deviates from 1. A deviation of 2.4% in A+B, for example A+B=1.024, results in a 2.4% relative error compared to the ideal waveform for all of the points that are plotted in the manner that was described with reference to FIG. 2. For example, the points located near the maximum voltage of points in the positive polarity shown at label 10 in FIG. 2 increase from about 1.0 for the ideal waveform to about 1.024 when the error is imposed.

Figure 3:
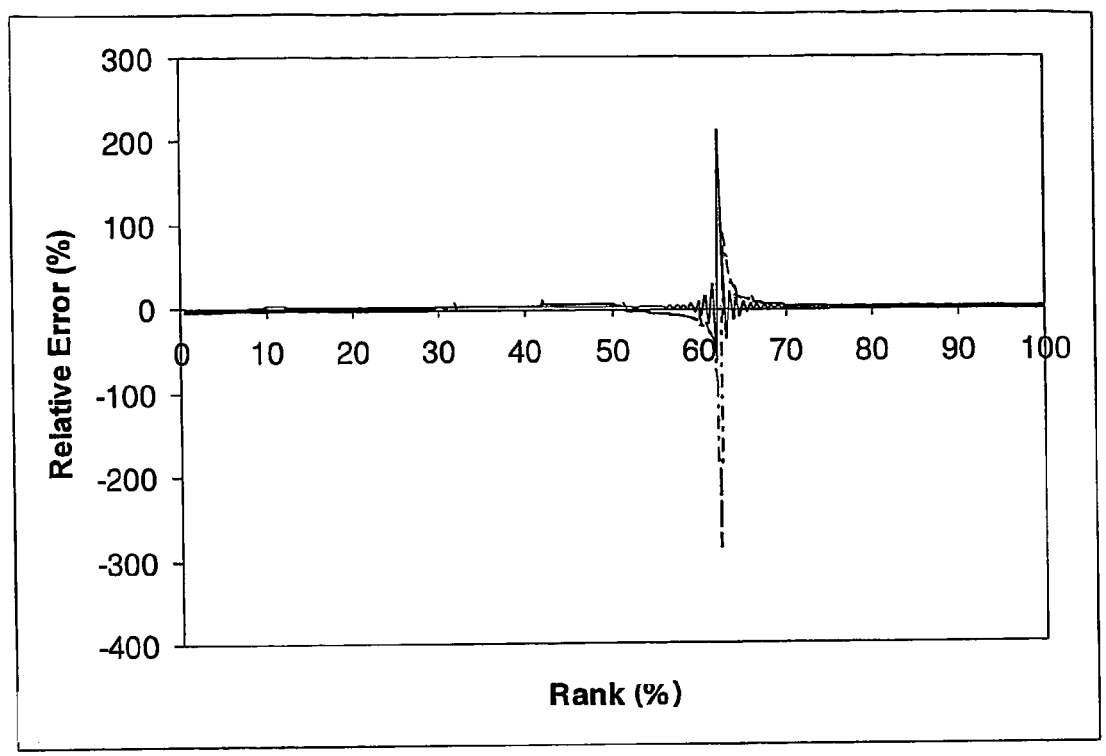
FIG. 3 shows an analysis of the magnitudes of changes and where deviations appear in the data of FIG. 2 as a result of three types of deviation from ideality.

Referring now to FIG. 3, shown are the relative error plots relating to differences between the ideal asymmetric waveform of FIG. 1 and different versions of the waveform, each different version of the waveform distorted by one of the three specific types of deviation described above.

Figure 4A:
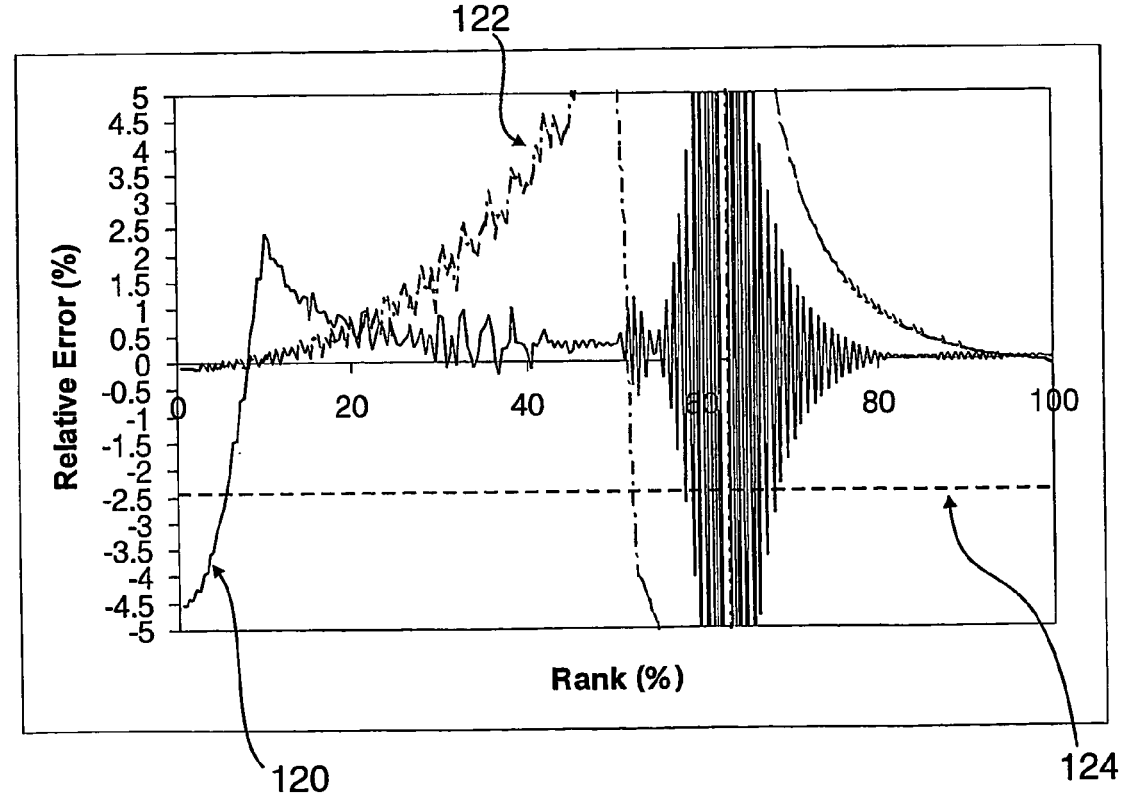
FIG. 4a shows the data of FIG. 3 on an expanded vertical scale.

Referring now to FIG. 4a, the same data that is contained in FIG. 3 is reproduced along an expanded vertical scale for improved clarity. A solid line 120 in FIG. 4a denotes a relative error plot corresponding to a waveform with a phase shift error, which also is shown separately in FIG. 4b. A dash-dot line 122 in FIG. 4a denotes a relative error in the relative amplitude of the component sinusoidal waves, which also is shown separately in FIG. 4c. A dashed line 124 in FIG. 4a denotes a relative error in the sum of the amplitudes of the component sinusoidal waves, which also is shown separately in FIG. 4d. The procedure for producing such relative error plots is described in greater detail, below.

The first step in the procedure for producing the relative error plots shown at FIGS. 4a to 4d is to collect a series of data points, i.e., signal voltage magnitudes during the asymmetric waveform, which represent all parts of the asymmetric waveform. For example, if 100 data points are collected rapidly in succession during one cycle of the asymmetric waveform, then this sampling of 100 points represents all times during the asymmetric waveform. If the data collection is uniform in time, then these 100 points are equally spaced over the duration of the asymmetric waveform. In a second step of processing the data, these 100 points are arranged in order from smallest to largest, so as to produce a plot similar to the one shown in FIG. 2. Next, each of the 100 points, which was arranged from smallest to largest, is compared with the points from an ideal asymmetric waveform. The points for an ideal asymmetric waveform are calculated by entering appropriate values of time t in Equation 2 as described above. The relative error is calculated as:

$$\frac{\text{(ideal waveform signal voltage)} - \text{(actual waveform signal voltage)}}{\text{(ideal waveform signal voltage)}} \quad (3)$$

A plot of the relative error difference i.e. normalized to the magnitude at that point is prepared as shown at FIG. 3 and FIGS. 4a to 4d. If the new data set represents a perfectly formed asymmetric waveform, then all data points are zero.

If the waveform being analyzed is generated with some error, for example a 5% error in the phase shift of the higher frequency sinusoidal wave, then the resulting asymmetric waveform is not shaped ideally. Although a plot of the distribution of signal voltage may look very much like FIG. 2 when arranged from most negative to most positive in magnitude, in fact there are significant differences in the shape of the actual waveform when compared to the ideal waveform. These differences are more apparent when the relative error is plotted as shown at FIG. 3 and FIG. 4b.

Figure 4B:
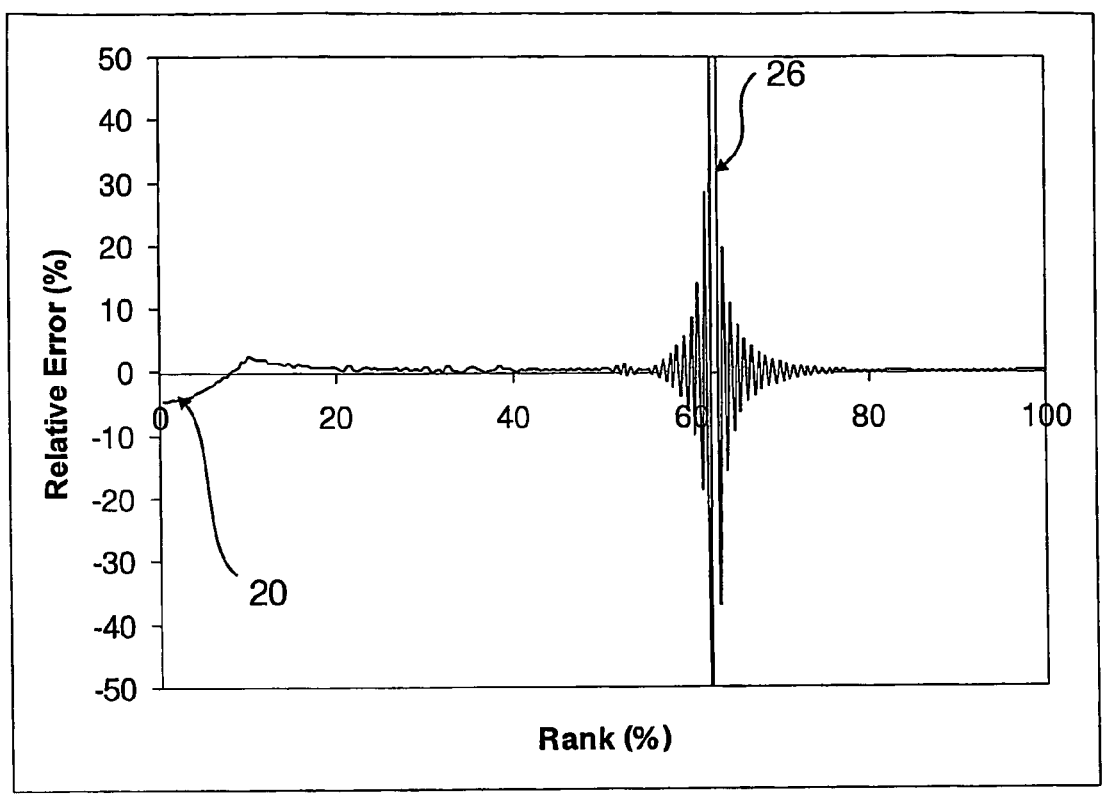
FIG. 4b shows a relative error plot corresponding to a waveform with a phase shift error.
Figure 4C:
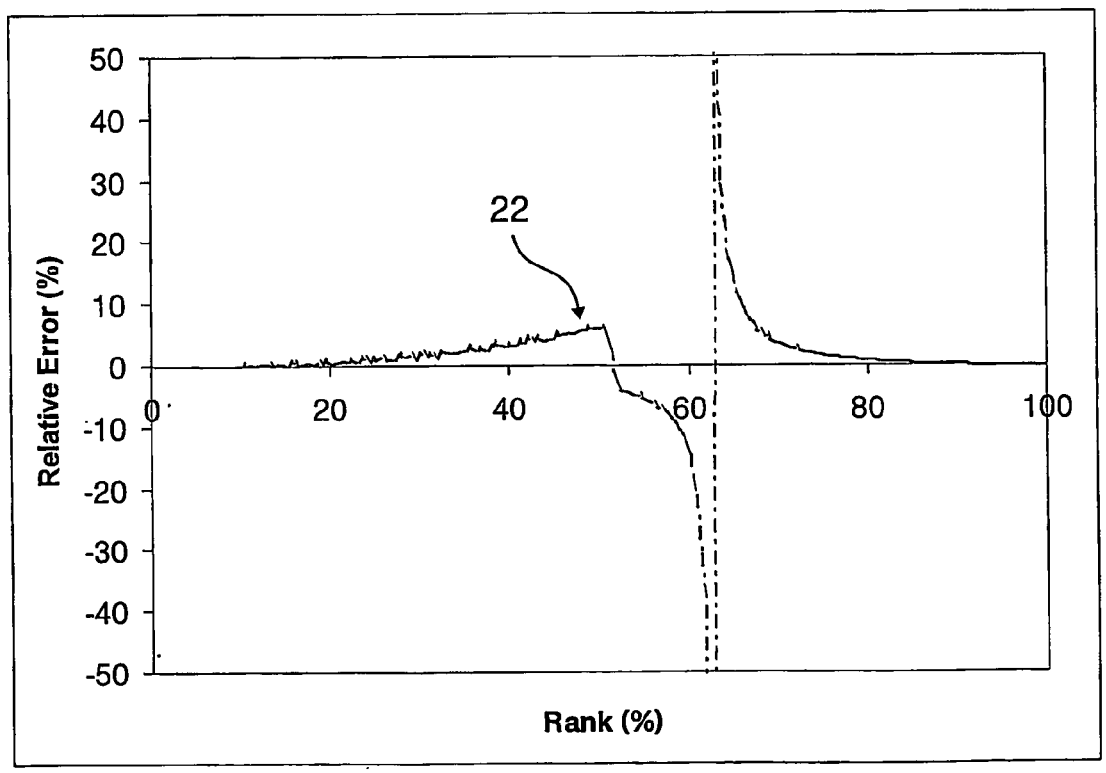
FIG. 4c shows a relative error plot corresponding to a waveform with an error in the relative amplitude of the component sinusoidal waves.
Figure 4D:
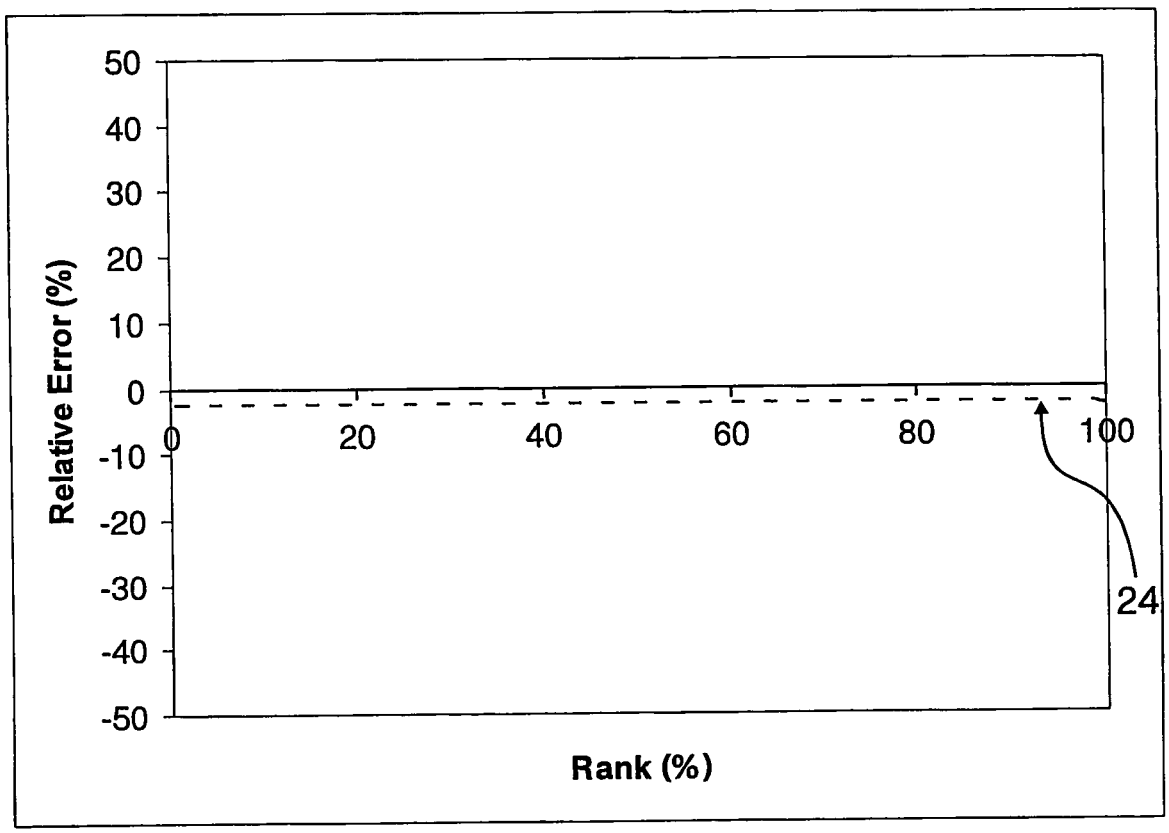
FIG. 4d shows a relative error plot corresponding to a waveform with an error in the sum of the amplitudes of the component sinusoidal waves.

For example, the 5% shift in phase angle results in a relative error plot that is shown in FIG. 3 and FIG. 4a at solid line 120 and at FIG. 4b. Since the data points are arranged from left to right in order of increasing magnitude of signal voltage, the data points of most negative polarity (in this example) appear near the label 20 in FIG. 4b and are approximately 4% lower than equivalent points in the case of the ideal asymmetric waveform. Accordingly, the phase angle shift has caused one of the minima 4 shown at FIG. 1 to become approximately 4% more negative that is expected in the ideal waveform. Although elsewhere on the plot, especially in the region shown by label 26, the relative errors can be very large, this large relative error is not as useful because the absolute values of the amplitudes of the data points are close to zero. In particular, the signal voltage changes from negative to positive at the polarity cross-over point 8 along the horizontal x-axis of FIG. 2 and is small in magnitude in this vicinity.

The second type of error, a 5% error in the ratio A/B, is shown as dash-dot line 122 in FIG. 3 and FIG. 4a. In the region near the label 22 in FIG. 4c it is seen that the relative error in the magnitude of the signal voltage from the distorted waveform differ from those of the ideal waveform by more than 3%. This region corresponds to data points labeled at 14 in FIG. 2, which are expected to be approximately constant and about ⅓ of the amplitude of the maximum in the opposite polarity. The data points labeled at 14 in FIG. 2 are indicative of the dip region 6 of FIG. 1.

The easiest type of error to observe is the third, in which the sum A+B is wrong, for example, by about 2.4%. The net result of this distortion is a relative error of 2.4% at every point throughout the cycle of the waveform. This is shown in FIG. 3, and in FIG. 4a as a dashed line 124, and in FIG. 4d.

Accordingly, the magnitude of each one of the three types of deviation from the ideal waveform is determined. The information relating to each one of the three types of deviation is used in a feedback and control system for optimizing the asymmetric waveform generator LC tuning electronics, in order to achieve an asymmetric waveform with the correct shape for stable performance of the FAIMS system attached thereto. The waveform parameters are:

(a) dispersion voltage (DV)=A+B
(b) A=2B
(c) phase angle, $\Theta=\pi/2$

The electronics of the waveform generator maintains these three relationships.

Figure 5:
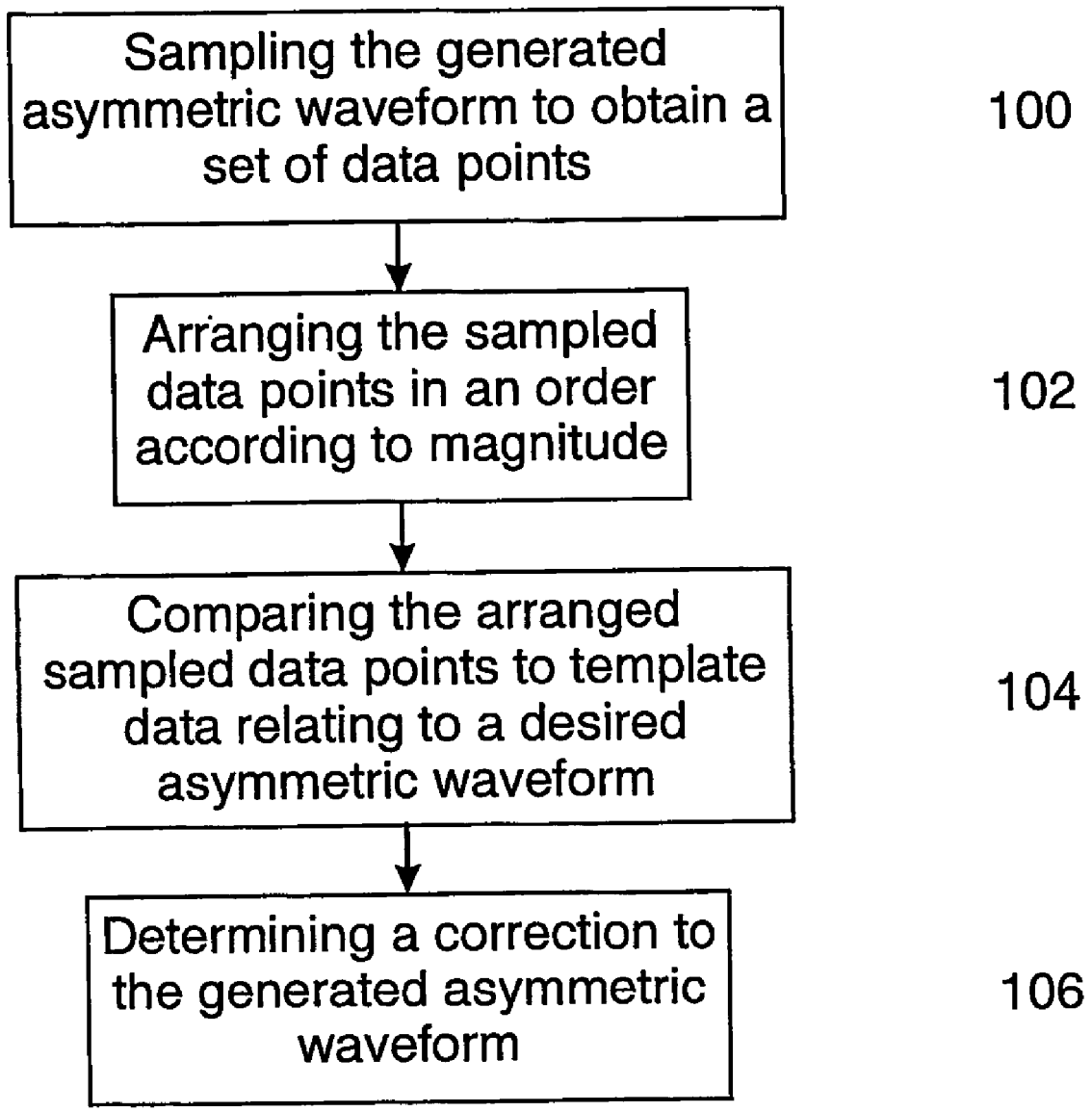
FIG. 5 shows a simplified flow diagram of a method of optimizing asymmetric waveform generator LC tuning electronics according to an embodiment of the instant invention.

Referring now to FIG. 5, shown is a simplified flow diagram of a method of optimizing asymmetric waveform generator LC tuning electronics according to an embodiment of the instant invention. At step 100 a generated asymmetric waveform is sampled to obtain a set of data points. For example, step 100 is performed as a fast analog-to-digital (A/D) sampling of the signal voltage to collect 100 data points within one cycle of the waveform. A plot of the magnitude, or A/D values, of these data points as a function of time of collection yields a trace that resembles an oscilloscope trace of the original generated asymmetric waveform. Alternatively, the set of data points is obtained as a slow, random, sampling version of A/D, which eventually collects sample data points from every portion of the generated asymmetric waveform. For example, the A/D collection of 100 data points randomly, one new data point each millisecond, results in the acquisition of the 100 data points in approximately 100 milliseconds. Since the asymmetric waveform is repeating rapidly, perhaps in the megahertz range, no two of these A/D data points is sampled from the same cycle of the waveform. However, each data point is sampled from somewhere during the cycle of the waveform. Similarly, each one of the following ninety-nine data points is sampled from a random point in a widely separated (in time) cycle of the waveform from the previous sampling. If the data points are actually random, then every region of the generated asymmetric waveform, given the finite number of data points collected, is sampled although one does not know from which time in the period of the generated asymmetric waveform each data point is acquired. One cannot reconstruct the equivalent of an oscilloscope trace of the original waveform shape because the "time" values of the data points relative to the original waveform is unknown, hence the randomness of this sampling method.

At step 102, the set of data points are arranged by order of magnitude, such as for example from most negative to most positive. If the data points are collected randomly from all parts of the waveform at step 100, then the distribution resembles that shown in FIG. 2 when plotted. Of course, generating a plot similar to the one shown in FIG. 2 is not an essential feature of the instant invention.

At step 104, the data points arranged by order of magnitude are compared to template data relating to a desired asymmetric waveform, for instance an ideal waveform. Preferably, three comparisons are performed at step 104: a first comparison for data points close to 100% along the horizontal axis of FIG. 4*a* to look for an error in A+B where A/B=2; a second comparison for data points close to 0% along the horizontal axis of FIG. 4*a* to look for an error in phase angle; and a third comparison for data points close to 45–50% along the horizontal axis of FIG. 4*a* to look for an error in A/B where A+B is equal to the DV.

When the result of the first comparison is indicative of a deviation from ideal shape, it is suggestive that the amplitude of the asymmetric waveform should be corrected. Having regard to the specific example shown at FIG. 4*d*, the amplitude of the asymmetric waveform should be decreased because the sum of A+B is too large, i.e. the trace must be moved "upwards" to zero. In particular, at step 104 a negative relative error of approximately 2.4% is determined in the data points near 100% along the horizontal axis. Since the relative error at any given point is determined according to [(ideal waveform voltage)−(actual waveform voltage)]/ (ideal waveform voltage), a negative relative error indicates that the actual waveform voltage exceeds the ideal waveform voltage. Advantageously, the other types of distortion do not cause a significant relative error in the data points near 100% along the horizontal axis. Accordingly, at step 106 a correction is determined for adjusting the sum of A+B to be equal to the DV.

After the sum A+B is set equal to the DV, the second comparison is performed. When the result of the second comparison is indicative of deviation from ideal shape, then the waveform suffers not from distortion in the magnitude of A+B, but rather from a phase shift error. A correction of the phase angle is therefore determined at step 106. This correction may be performed in an iterative manner, until the deviation is reduced to zero. Clearly, the relative error that is determined in the data points near 0% along the horizontal axis can also have a contribution from the A+B function. In particular, the dashed line 124 extends from 0% to 100% in FIG. 4*a* with a constant relative error value of −2.4%. Accordingly, the sum A+B should be set to the correct value prior to attempting to adjust the phase angle, and the sum A+B should be revised repeatedly during the phase angle adjustment.

When the result of the third comparison is indicative of deviation from ideal shape, and when the A+B function error is close to zero, then a distortion may arise as a result of an error in the magnitude of A/B; This type of deviation is indicated by non-zero relative errors in the 45–50% range of data points. In this case, a correction of the A/B function is determined at step 106.

Figure 6:
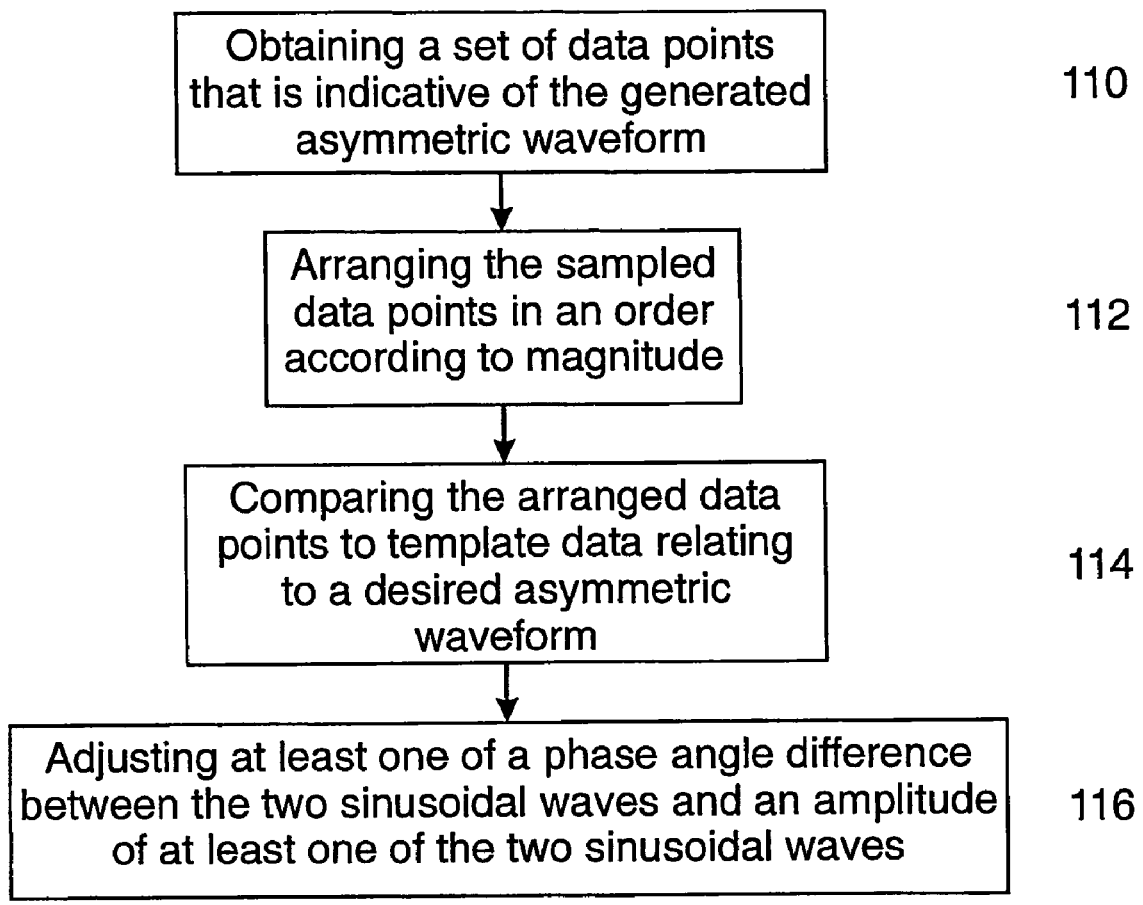
FIG. 6 shows a simplified flow diagram of a method of optimizing asymmetric waveform generator LC tuning electronics according to another embodiment of the instant invention.

Referring now to FIG. 6, shown is a simplified flow diagram of a method of optimizing asymmetric waveform generator LC tuning electronics according to another embodiment of the instant invention. At step 110, a set of data points is obtained that is indicative of the generated asymmetric waveform. For example, the generated asymmetric waveform is sampled as described with reference to FIG. 5, or the set of data points is obtained in a different way. Once obtained, the set of data points are arranged by order of magnitude, such as for example from smallest to largest, at step 112. At step 114, the data points arranged by order of magnitude are compared to template data relating to a desired asymmetric waveform, for instance an ideal waveform. Preferably, three comparisons are performed at step 114: a first comparison for data points close to 100% along the horizontal axis of FIG. 4; a second comparison for data points close to 0% along the horizontal axis of FIG. 4; and a third comparison for data points close to 45–50% along the horizontal axis of FIG. 4. In dependence upon the comparison at step 114, an adjustment is made at step 116 to at least one of a phase angle difference between the two sinusoidal waves and an amplitude of at least one of the two sinusoidal waves.

These calculations, described for example with reference to FIGS. 5 and 6, are readily implemented in control software of the waveform generator. The type of error is determined and appropriate corrective actions are taken. Correction of the phase angle or the correction of the ratio A/B can be performed in either order, but the A+B function must be set first to the correct value. Referring again to FIG. 4, a small error in the phase angle has minimum contribution to the relative error at the 45–50% region of FIG. 4. Similarly, small shifts of A/B contribute small relative errors in the 0–5% region of FIG. 4.

Figure 7:
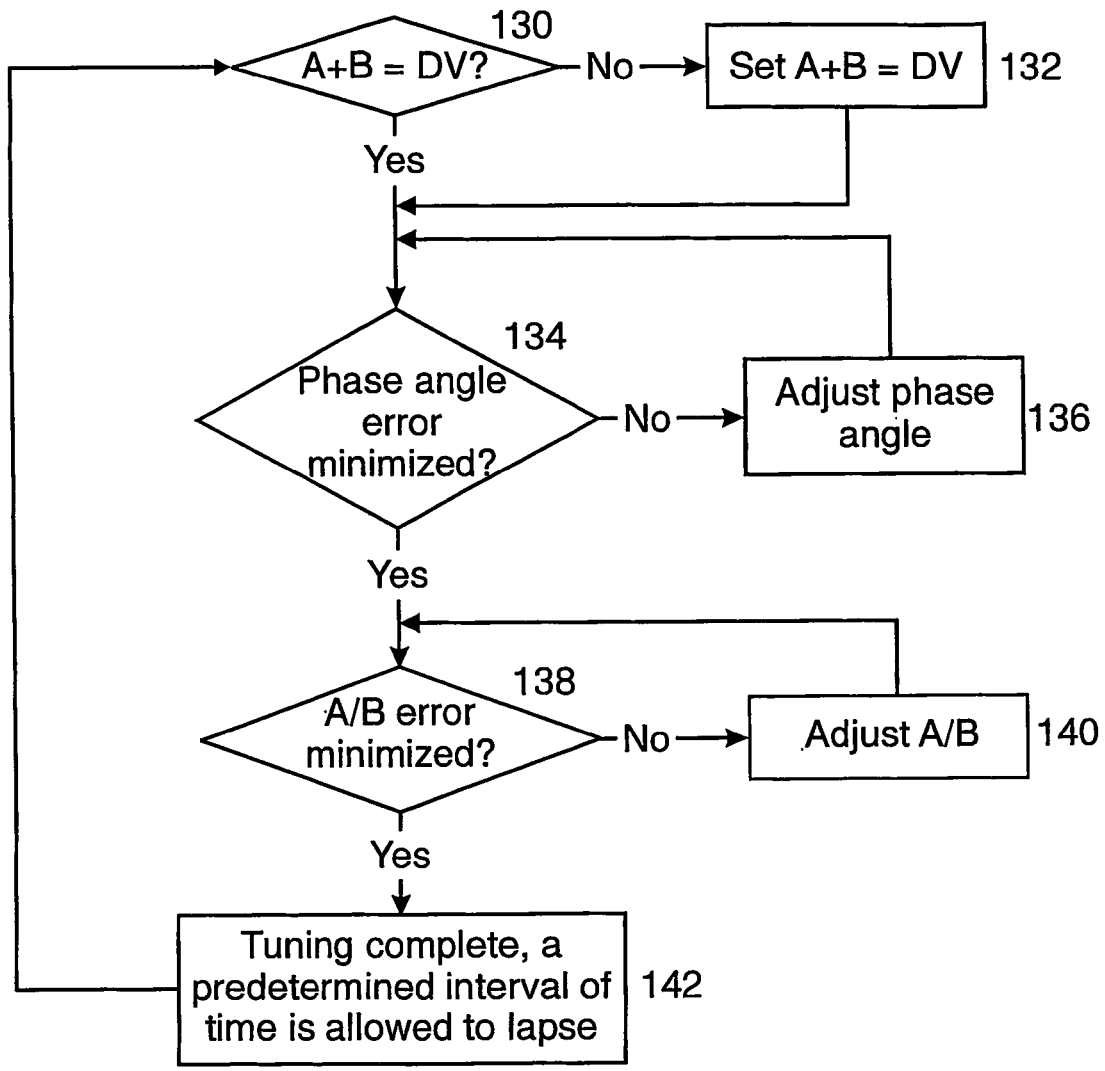
FIG. 7 shows a simplified flow diagram of a method of adjusting the different waveform parameters.
Figure 8:
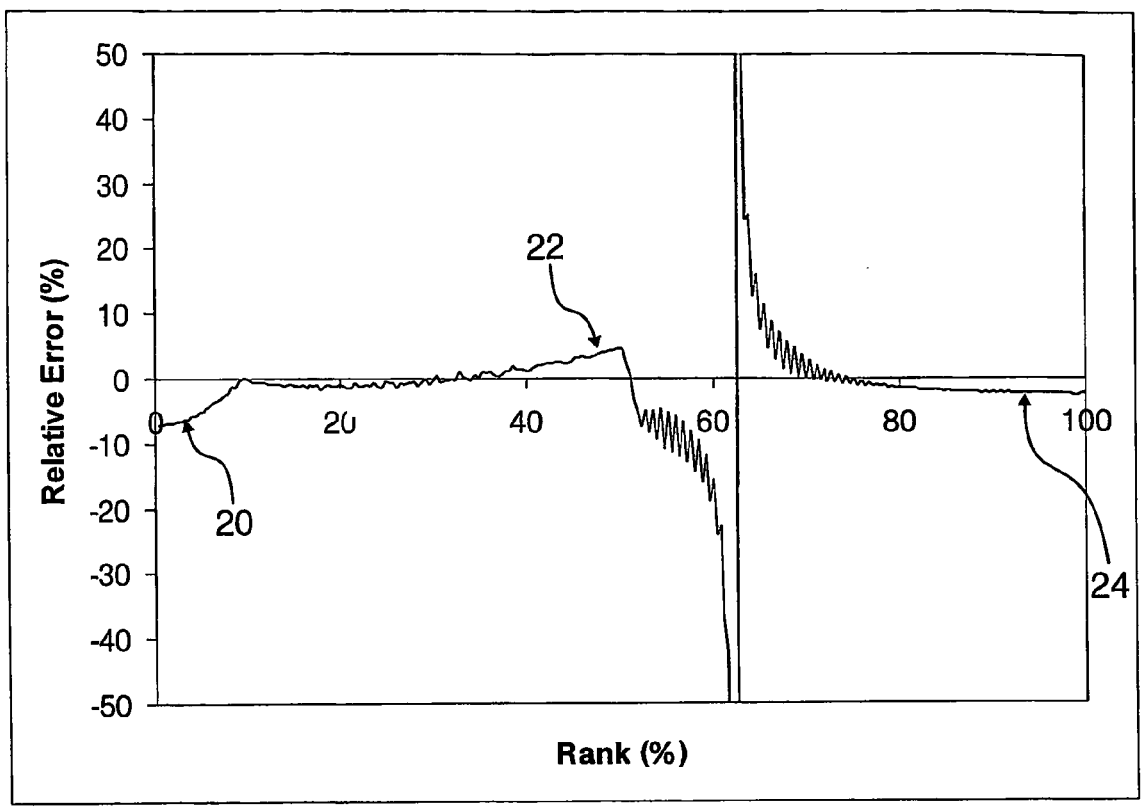
FIG. 8 shows a trace of an asymmetric waveform having an A+B type error, a phase angle error and an A/B type error superimposed thereon.
Figure 9:
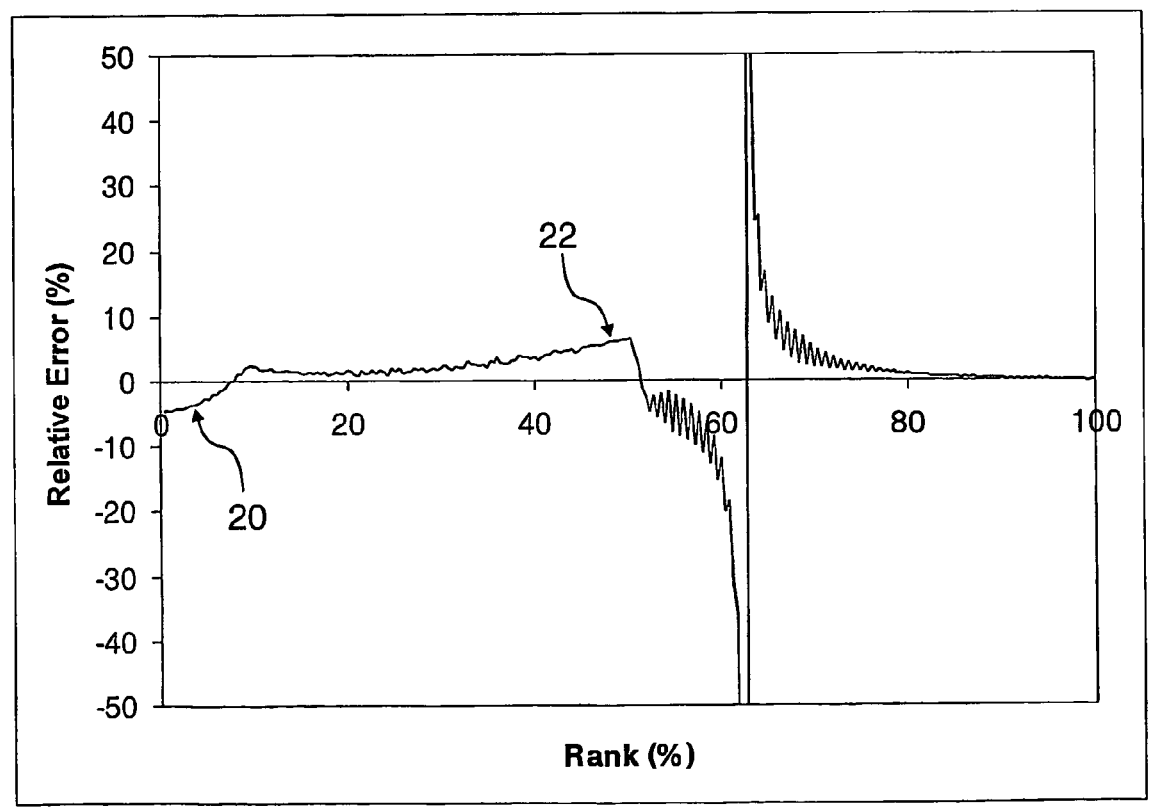
FIG. 9 shows a trace of an asymmetric waveform having a phase angle error and an A/B type error superimposed thereon; and, FIG. 10 shows a simplified flow diagram of another method of adjusting the different waveform parameters.

Referring now to FIG. 7, shown is a simplified flow diagram of a method of adjusting the different waveform parameters arising from minor fluctuations during operation. The method of FIG. 7 is implemented, for example, subsequent to step 106 of FIG. 5 or during step 116 of FIG. 6. At decision step 130 it is determined whether the sum A+B is equal to DV. If no, as shown in FIG. 8 at label 24, then at step 132 the sum A+B is adjusted. For example, if A+B is too large, the amplitudes of both sinusoidal waves that are used to form the waveform are decreased. This returns the sum A+B to the correct value as shown by the relative error of 0% at 100% rank of data points in FIG. 9. At decision step 134, it is determined whether the phase angle error is minimized. If no, then at step 136 one sinusoidal wave is shifted relative to the other. The shifts are applied until the relative error at label 20 in FIG. 9 approaches zero. Preferably, the sum A+B is also adjusted as necessary, such that A+B continues to equal the DV. At decision step 138 it is determined whether the error in the ratio of A/B is minimized. If no, then at step 140 the amplitude of one of the sinusoidal waves is increased while the amplitude of the second sinusoidal wave is decreased, for example. The corrections are applied until the relative error at label 22 in FIG. 9 determined at decision step 138 decreases to a minimum value, but not necessarily to zero. Preferably, the sum A+B is also adjusted as necessary, such that A+B continues to equal the DV. Once it is determined that the errors in both the phase angle and the amplitudes of the sinusoidal waves are within predetermined threshold values, tuning is complete. At step 142 a predetermined interval of time is allowed to lapse before returning to step 130 to check the waveform for errors. Advantageously, the generated asymmetric waveform is optimized and maintained in its ideal form by a cyclic process of repeating these tests and adjusting the amplitudes and phases of the sinusoidal waves used to produce the asymmetric waveform.

Figure 10:
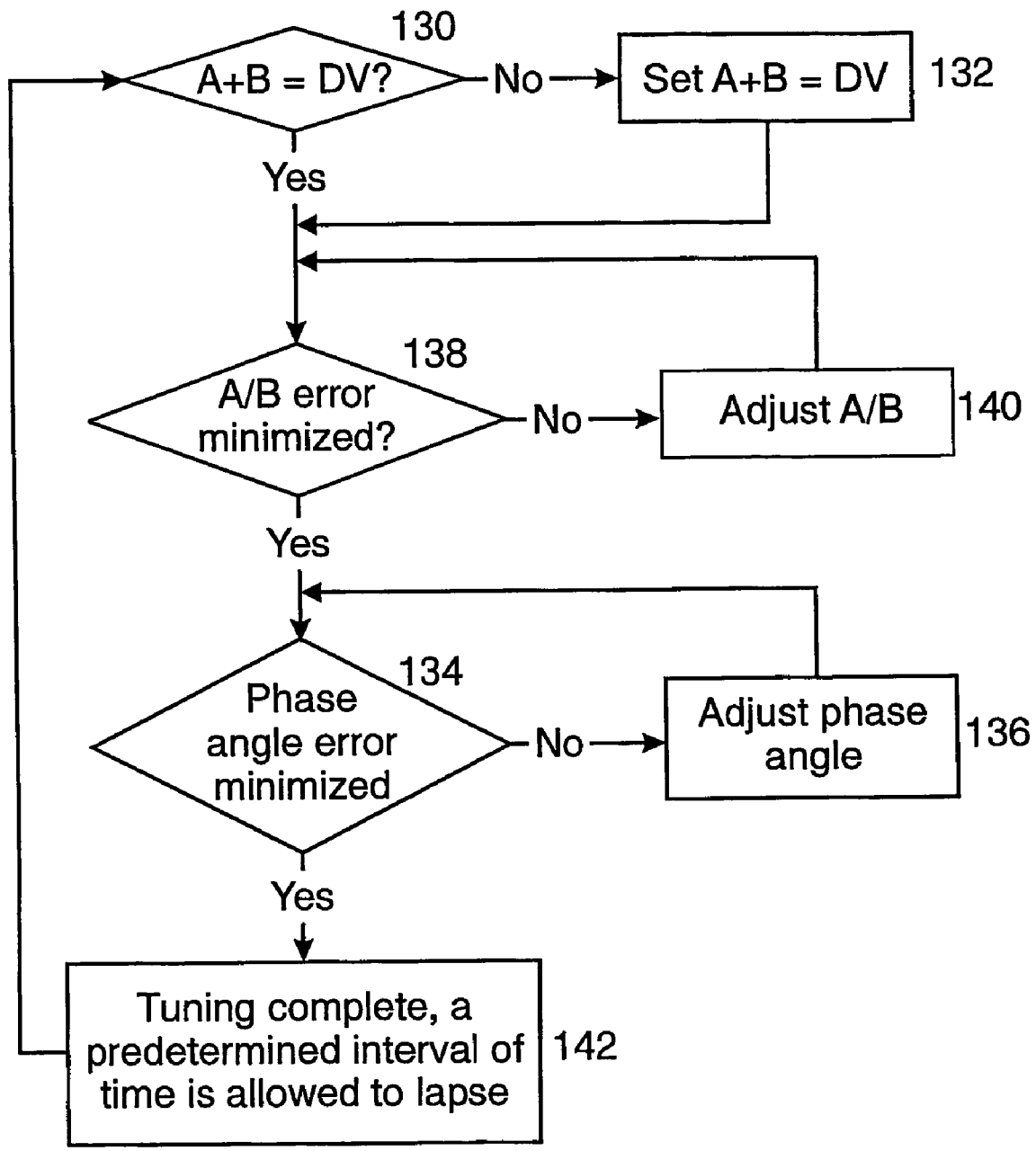

Referring now to FIG. 10, shown is a simplified flow diagram of another method of adjusting the different waveform parameters. According to this alternative method, the ratio of A/B is corrected before the phase angle is corrected. The method of FIG. 10 is implemented, for example, subsequent to step 106 of FIG. 5 or during step 116 of FIG. 6. At decision step 130 it is determined whether the sum A+B is equal to DV. If no, then at step 132 the sum A+B is adjusted. For example, if A+B is too large, the amplitudes of both sinusoidal waves that are used to form the waveform are decreased. This returns the A+B to the correct value. At decision step 138, it is determined whether the relative error in the ratio of A/B is minimized. If no, then at step 140 the amplitude of one of the sinusoidal waves is increased while the amplitude of the second sinusoidal wave is decreased, for example. The corrections are applied until it is determined at decision step 138 that the relative error in the ratio of A/B is a minimum value, but not necessarily zero. Preferably, the sum A+B is also adjusted as necessary, such that A+B continues to equal the DV. Finally, at decision step 134 it is determined whether the phase angle error is minimized. If no, then one sinusoidal wave is shifted relative to the other at step 136. The shifts are applied until the relative error at label 20 in FIG. 9 approaches zero. Preferably, the sum A+B is also adjusted as necessary, such that A+B continues to equal the DV. When it is determined that the relative errors in both the ratio A/B and the phase angle are within predetermined threshold values, tuning is complete and at step 142 a predetermined interval of time is allowed to lapse before returning to step 130 to check for fluctuations in the waveform. Advantageously, the generated asymmetric waveform is optimized and maintained in its ideal form by a cyclic process of repeating these tests and adjusting small errors in the amplitudes and phases of the sinusoidal waves occurring due to, for instance, random environmental fluctuations.

Numerous other embodiments may be envisaged without departing from the spirit and scope of the instant invention.

What is claimed is:

1. A method of controlling an asymmetric waveform generated by an asymmetric waveform generator as a combination of two sinusoidal waves having respective frequencies that differ from each other by a factor of two, the method comprising the steps of:
   sampling the generated asymmetric waveform to obtain a set of data points that is indicative of the generated asymmetric waveform;
   arranging the sampled data points in an order according to magnitude;
   comparing the arranged sampled data points to template data relating to a desired asymmetric waveform;
   in dependence upon the comparison, determining a correction to the generated asymmetric waveform, the determined correction for adjusting at least one of a phase angle difference between the two sinusoidal waves and an amplitude of at least one of the two sinusoidal waves; and,
   adjusting LC tuning electronics of the asymmetric waveform generator in dependence upon the determined correction, so as to control the asymmetric waveform being generated thereby.

2. A method according to claim 1, wherein the generated asymmetric waveform has the general form $V(t) = A \sin(\omega t) + B \sin(2\omega t - \Theta)$, where V(t) is the asymmetric waveform voltage as a function of time, A is the amplitude of the first sine wave at frequency $\omega$, where $\omega$ is the frequency in radians/sec, B is the amplitude of the second sine wave at a frequency $2\omega$, and $\Theta$ is a phase angle offset between the first sinusoidal wave and the second sinusoidal wave.

3. A method according to claim 2, wherein the determined correction is for satisfying the condition A+B is equal to a desired asymmetric waveform peak voltage.

4. A method according to claim 3, wherein the determined correction is for satisfying the condition $\Theta = \pi/2$.

5. A method according to claim 4, wherein the determined correction is for satisfying the condition that A/B equals a predetermined value.

6. A method according to claim 3, wherein the determined correction is for satisfying the condition that A/B equals a predetermined value.

7. A method according to claim 2, wherein the determined correction is for satisfying the condition $\Theta = \pi/2$.

8. A method according to claim 2, wherein the determined correction is for satisfying the condition that A/B equals a predetermined value.

9. A method according to claim 2, including the step of repeating the steps of claim 1 in an iterative fashion.

10. A method according to claim 1, comprising a step of obtaining the template data, the template data including a set of data points relating to the desired asymmetric waveform.

11. A method according to claim 10, wherein the step of comparing comprises a step of determining a difference between each arranged sampled data point and a corresponding data point of the template data.

12. A method according to claim 10, wherein the step of obtaining template data comprises the step of retrieving template data from a memory.

13. A method according to claim 10, wherein the step of obtaining template data comprises the step of evaluating $V(t)=A\sin(\omega t)+B\sin(2\omega t-\Theta)$ for each one of a plurality of t-values, for determining a first set of data points, and further comprises the step of arranging the first set of data points in an order according to magnitude.

14. A method according to claim 10, wherein the set of data points that is indicative of the generated asymmetric waveform and the template data relating to the desired asymmetric waveform include a same number of data points.

15. A method according to claim 1, wherein the step of sampling is performed as an analog-to-digital sampling for collecting data points contained within one cycle of the generated asymmetric waveform.

16. A method according to claim 1, wherein the step of sampling is performed as an analog-to-digital sampling, for collecting data points from a plurality of portions of the generated asymmetric waveform during a period of time overlapping with a plurality of different cycles of the generated asymmetric waveform.

17. A method according to claim 1, including the step of repeating the steps of claim 1 in an iterative fashion.

18. A storage medium encoded with machine-readable computer program code for controlling an asymmetric waveform generated by an asymmetric waveform generator as a combination of two sinusoidal waves having respective frequencies that differ from each other by a factor of two, the storage medium including instructions for:

obtaining a set of data points that is indicative of the generated asymmetric waveform;

arranging the data points in an order according to magnitude;

obtaining template data including a set of data points relating to a desired asymmetric waveform;

comparing values of data points within a predetermined range of the arranged data points to values of data points within a corresponding predetermined range of the template data;

in dependence upon the comparison, determining a correction to the generated asymmetric waveform, the determined correction for adjusting at least one of a phase angle difference between the two sinusoidal waves and an amplitude of at least one of the two sinusoidal waves; and, adjusting LC tuning electronics of the asymmetric waveform generator in dependence upon the determined correction, so as to control at least one of the phase angle difference between the two sinusoidal waves and the amplitude of at least one of the two sinusoidal waves.

* * * * *